(12) United States Patent
Lin et al.

(10) Patent No.: US 8,455,946 B2
(45) Date of Patent: Jun. 4, 2013

(54) LATERAL STACK-TYPE SUPER JUNCTION POWER SEMICONDUCTOR DEVICE

(75) Inventors: Yung-Fa Lin, Hsinchu (TW); Shou-Yi Hsu, Hsinchu (TW); Meng-Wei Wu, Hsinchu (TW); Chia-Hao Chang, Hsinchu (TW)

(73) Assignee: Anpec Electronics Corporation, Hsin-Chu (TW)

( * ) Notice: Subject to any disclaimer, the term of this patent is extended or adjusted under 35 U.S.C. 154(b) by 0 days.

(21) Appl. No.: 13/337,274

(22) Filed: Dec. 26, 2011

(65) Prior Publication Data
US 2013/0082324 A1 Apr. 4, 2013

(30) Foreign Application Priority Data
Sep. 29, 2011 (TW) .............................. 100135211 A

(51) Int. Cl.
*H01L 29/66* (2006.01)

(52) U.S. Cl.
USPC ........... 257/331; 257/332; 257/341; 257/274; 438/270; 438/341; 438/197; 438/514

(58) Field of Classification Search
USPC ................. 257/155, 197, 183, 272, 273, 370, 257/373, 378, 474, 477, 511, 514, 517, 526, 257/552, 565, 134, 133, 130, 131, 132, 170, 257/151, 152, 153, 154, E29.197, E29.201, 257/E29.027, E21.609, E21.418, E29.189, 257/E27.096, E27.057, E27.055, 330, 332, 257/302, 331, 341, 104, 135, 274, 278, 279, 257/288; 438/FOR. 424, 270, 309, 341, 189, 438/188, 186, 202, 205, 208, 220, 234, 170, 438/570, 207, 313, 318, 337, 345, 340, 133, 438/197, 370, 373, 506, 514
See application file for complete search history.

(56) References Cited

U.S. PATENT DOCUMENTS

| | | | | |
|---|---|---|---|---|
| 5,381,026 | A * | 1/1995 | Shinohe et al. | ............... 257/147 |
| 5,895,952 | A * | 4/1999 | Darwish et al. | ............... 257/330 |
| 2002/0024106 | A1* | 2/2002 | Ootsuka et al. | ............... 257/393 |

* cited by examiner

*Primary Examiner* — Thanh Y Tran
(74) *Attorney, Agent, or Firm* — Winston Hsu; Scott Margo

(57) ABSTRACT

A lateral stack-type super junction power semiconductor device includes a semiconductor substrate; an epitaxial stack structure on the semiconductor substrate, having a first epitaxial layer and a second epitaxial layer; a drain structure embedded in the epitaxial stack structure and extending along a first direction; a plurality of gate structures embedded in the epitaxial stack structure and arranged in a segmental manner along the first direction; a source structure between the plurality of gate structures; and an ion well encompassing the source structure.

18 Claims, 17 Drawing Sheets

LATERAL STACK-TYPE SUPER JUNCTION POWER SEMICONDUCTOR DEVICE

BACKGROUND OF THE INVENTION

1. Field of the Invention

The invention generally relates to the field of semiconductor power devices. More particularly, the present invention relates to a lateral stack-type super junction power semiconductor device.

2. Description of the Prior Art

Power devices are mainly used in power management; for instance, in switching power supplies, in management integrated circuits in the core or peripheral regions of computers, in backlight power supplies, and in electric motor controls. This type of power devices, as described above, includes an insulated gate bipolar transistor (IGBT), a metal-oxide-semiconductor field effect transistor (MOSFET), or a bipolar junction transistor (EU), among which the MOSFET is the most widely utilized because of its energy saving properties and its ability to provide faster switch speed.

In one kind of power device, a P-type epitaxial layer and an N-type epitaxial layer are alternatively disposed to form several vertical PN junctions inside a structure, and the junctions are perpendicular to the surface of the structure. A structure comprising said described PN junctions is called a vertical super-junction structure. In a conventional method for fabricating the super-junction structure, an epitaxial layer of a first conductivity type, e.g. N-type, is formed on a substrate of the first conductivity type. Then, a plurality of trenches is etched into the first conductivity type epitaxial layer using a first mask. A second conductivity type epitaxial layer, e.g. P-type epitaxial layer, is used to fill the trenches, and the surface of the second conductivity type epitaxial layer is leveled with the surface of the first conductivity type epitaxial layer. Hence, the trenches are filled with the second conductivity type epitaxial layer and are surrounded by the first conductivity type epitaxial layer. As a result, a super-junction structure with a plurality of vertical PN junctions is formed.

The above-mentioned method, however, still has many drawbacks. For instance, when comparing to conventional IGBT power devices, a power device with vertical PN junctions has a relatively high on-state resistance for the same voltage sustaining ability. A conventional way to reduce the resistance in the power device with vertical PN junctions is to fabricate trenches with a relatively high aspect-ratio. However, the fabrication of trenches with higher aspect-ratio is limited by technical means and high fabricating costs. In light of the above, there is still a need for fabricating a power device that would be capable of overcoming the shortcomings and deficiencies of the prior art.

SUMMARY OF THE INVENTION

It is therefore one objective of the invention to provide a lateral stack-type super junction power device that can surpass the drawbacks of the prior art.

To this end, according to one embodiment of the invention, the present invention provides a lateral stack-type super junction power semiconductor device comprising: a semiconductor substrate with a first conductivity type doping; an epitaxial stack structure on the semiconductor substrate, having at least a first epitaxial layer with a second conductivity type doping and at least a second epitaxial layer of the first conductivity type; a drain structure embedded in the epitaxial stack structure along a first direction; a plurality of gate structures embedded in the epitaxial stack structure arranged in a segmental manner along the first direction; a source structure between the plurality of gate structures; and an ion well of the first conductivity type encompassing the source structure.

According to another embodiment, the present invention provides a lateral stack-type super junction power semiconductor device comprising: a semiconductor substrate with a first conductivity type doping; an epitaxial stack structure on the semiconductor substrate, having at least a first epitaxial layer with a second conductivity type doping and at least a second epitaxial layer of the first conductivity type; a drain structure embedded in the epitaxial stack structure along a first direction; a gate structure embedded in the epitaxial stack structure along the first direction; a source structure disposed on one of the sides of the gate structure; and an ion well of the first conductivity type encompassing the source structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1A:
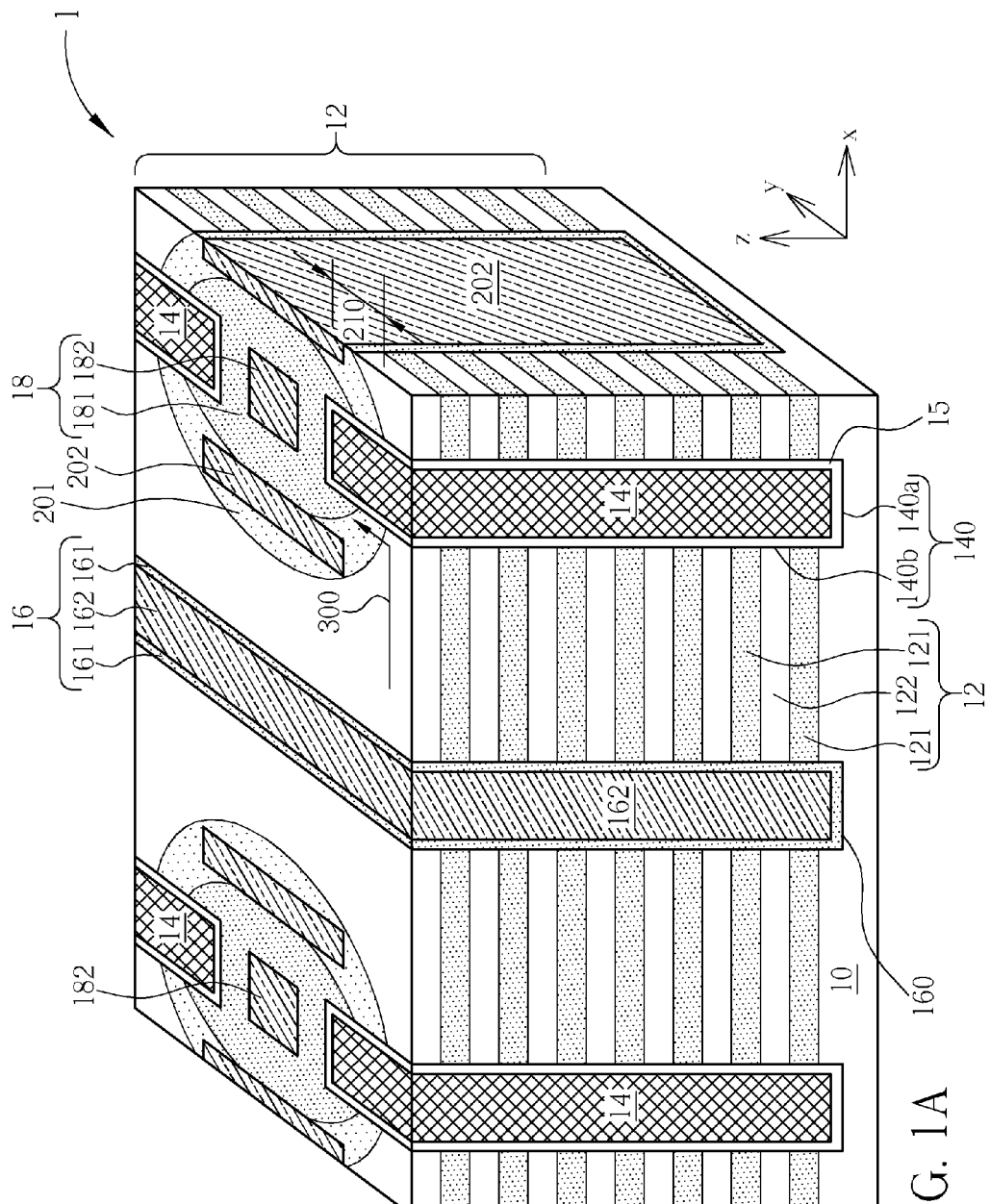
FIG. 1A is a schematic, cross-sectional 3D diagram showing a structure of a lateral stack-type super junction power semiconductor device according to a first embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be obtained without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of the presentation. When multiple embodiments are disclosed and described as having some features in common, similar features will be described with the same reference numerals for ease of illustration and description thereof.

Figure 1B:
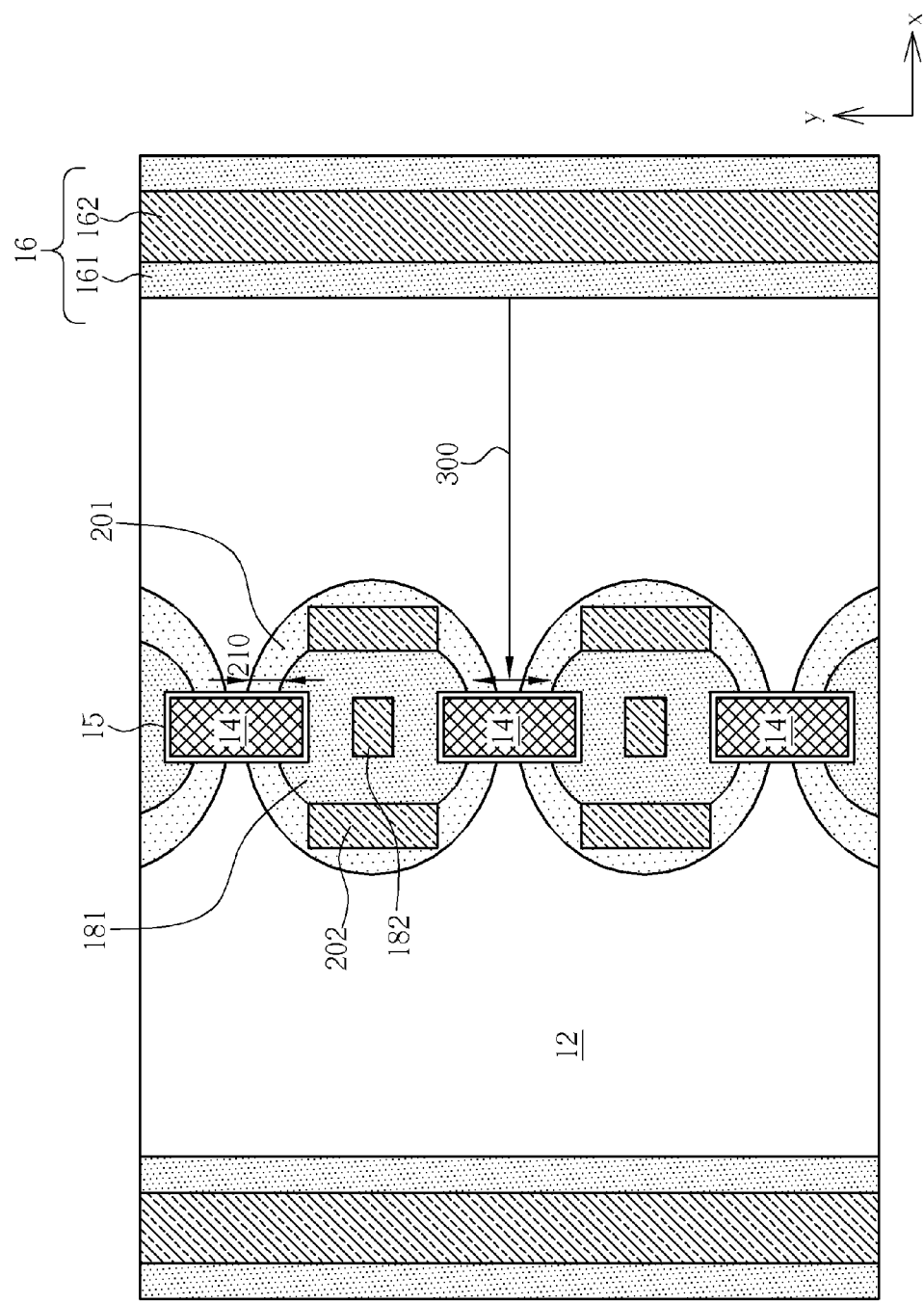
FIG. 1B is a schematic top-view showing a structure of a lateral stack-type super junction power semiconductor device according to a first embodiment of the invention.

Please refer to FIGS. 1A and 1B. FIGS. 1A and 1B are cross-sectional diagrams showing a lateral stack-type super junction power semiconductor device. As shown in FIGS. 1A and 1B, lateral stack-type super junction power semiconductor device 1 comprises a semiconductor substrate 10 with a first conductivity type, for example P-type silicon substrate. An epitaxial stack layer 12 is disposed above the semiconductor substrate 10, wherein the layer 12 consists of a plurality of epitaxial layers epitaxial layer 121 of a second conductivity type, N-type for example, and epitaxial layers epitaxial layer 122 of the first conductivity type. The layers 121 and 122 are arranged alternatively along a Z-axis direction. The interfaces between the epitaxial layers 121 and 122 are therefore approximately parallel to a surface (or XY plane) of the semiconductor substrate 10. The interfaces consist of a plurality of PN junctions and are known as "super-junctions". A thickness of the epitaxial layers 121 may be equal to that of the epitaxial layers 122, but is not limited thereto. For example, an epitaxial layer 121 in direct contact with the semiconductor substrate 10 may be thicker than other epitaxial layers 121, so that a resistance of the device can be reduced. In addition, a layer in direct contact with the semiconductor substrate 10 is not limited to the epitaxial layer 121, that is to say the epitaxial layer 122 may be another candidate. The stacking priority depends on the requirements of doping concentration and thickness.

A drain trench 160 formed along a y-axis direction is located inside the epitaxial stack layer 12 has drain diffusion regions 161 of the second conductivity type disposed on each of the drain trench 160 sidewalls. The bottom of the drain trench 160 extends into the semiconductor substrate 10 and the drain trench 160 is filled up with a drain contact layer 162, like a metal layer for example. According to this embodiment, the drain diffusion region 161 and the drain contact layer 162 constitute a drain structure 16. According to another embodiment of the invention, a depth of the drain trench 160 may be adjusted so that only the epitaxial layer 121 in direct contact with the semiconductor substrate 10 is exposed.

A gate trench 140 formed along the y-axis direction is disposed opposite to the drain 16, wherein the gate trench 140 has a sidewall 140b and a bottom 140a that expose the semiconductor substrate 10. Similarly, according to another embodiment of the invention, the depth of the gate trench 140 may also be adjusted in order to only expose the epitaxial layer 121 that is in direct contact with the semiconductor substrate 10. A gate dielectric layer 15 is formed on the bottom 140a and the sidewall 140b, and a gate conductive layer 14 fills up the gate trench 140. According to one embodiment of the invention, the gate trench 140 is arranged in a segmental manner along the y-axis direction and a source trench 180 is disposed between the adjacent gate trench 140, whose depth is approximate equal to that of the drain trench 160. The source trench 180 has a heavily doped source diffusion region 181 of the second conductivity type and the source trench 180 is filled up with a source contact layer 182, like a metal for example.

The heavily doped source diffusion region 181 and source contact layer 182 constitute a source structure 18. In addition, the source diffusion region 181 is encompassed by an ion well 201 of the first conductivity type. An ion well trench 200 is disposed inside the ion well 201, whose depth is approximately equal to that of the drain trench 160, or source trench 180. An ion well contact layer 202, made of metal for example, fills up the ion well trench 200. A gate channel 210 having a gate length and a gate width is formed at an overlapping region between the ion well 201 and the gate conductive layer 14. Each gate width is defined by each one of the epitaxial layers 121. The FIG. 1A also depicts a current path 300 where a current flows from the drain 16 via the epitaxial layers 121 through the gate channel 210 and finally flows into the source structure 18.

Figure 2:
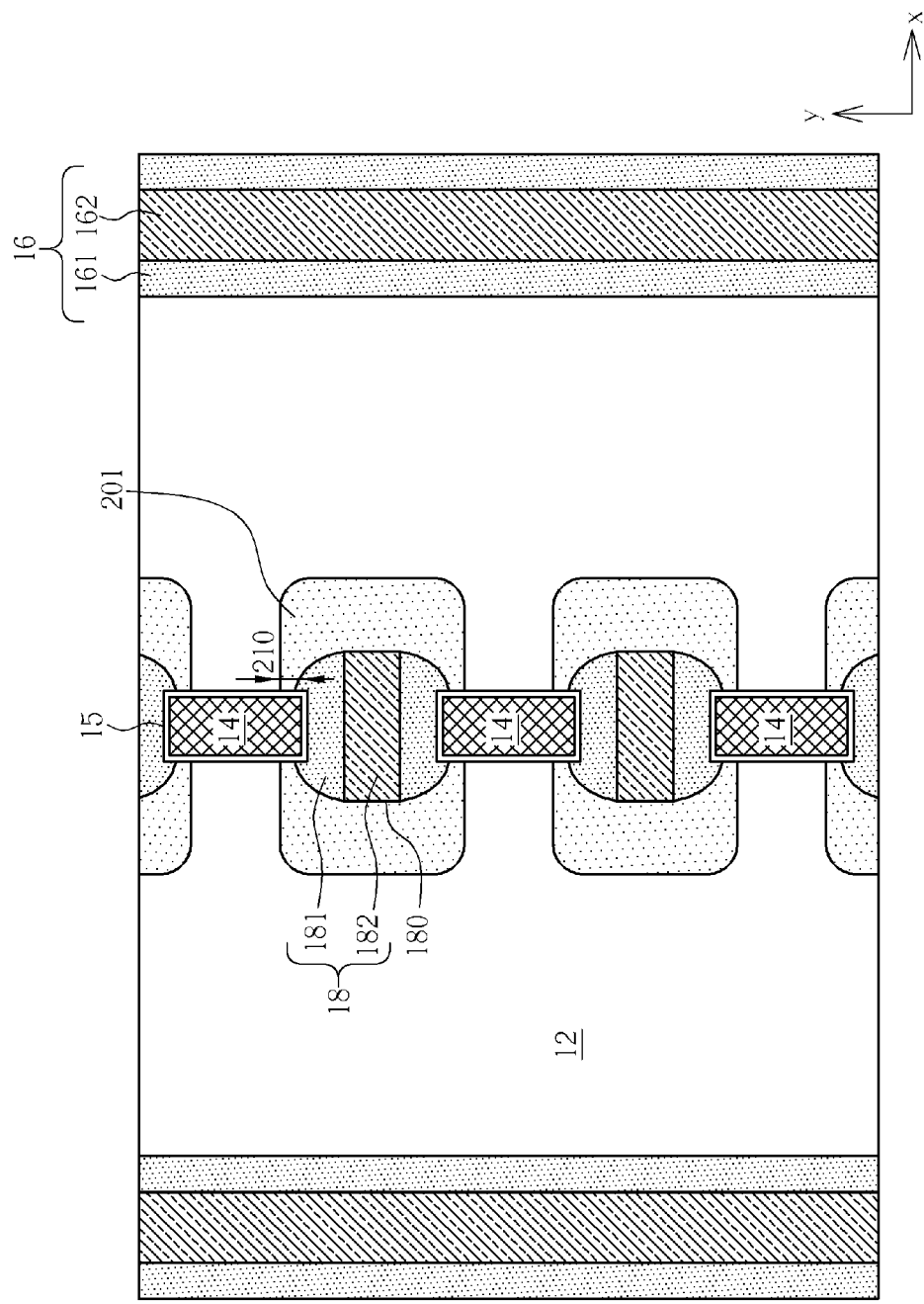
FIG. 2 is a schematic top-view showing a structure of a lateral stack-type super junction power semiconductor device according to a second embodiment of the invention.

FIG. 2 is a top-view showing a lateral stack-type super junction semiconductor device according to the second embodiment of the invention, wherein similar layers, devices, and regions are described with the same numerals. Comparing to FIG. 1B, a source trench 180 depicted in FIG. 2 is wider in the x-axis direction so that the source contact layer 182 may directly contact the ion well 201 encompassing the source structure 18. The heavily doped source diffusion regions 181 are formed in pairs on opposite sides of the source trench 180. It should be noted that, according to this embodiment, there is no ion well trench inside the ion well 201. A gate channel 210 is formed in a region where the ion well 201 overlaps the gate conductive layer 14, which is next to the source diffusion region 181. The gate channel 210 defines a gate length, and a width of gate channel 210 is defined by each epitaxial layer 121.

Figure 3:
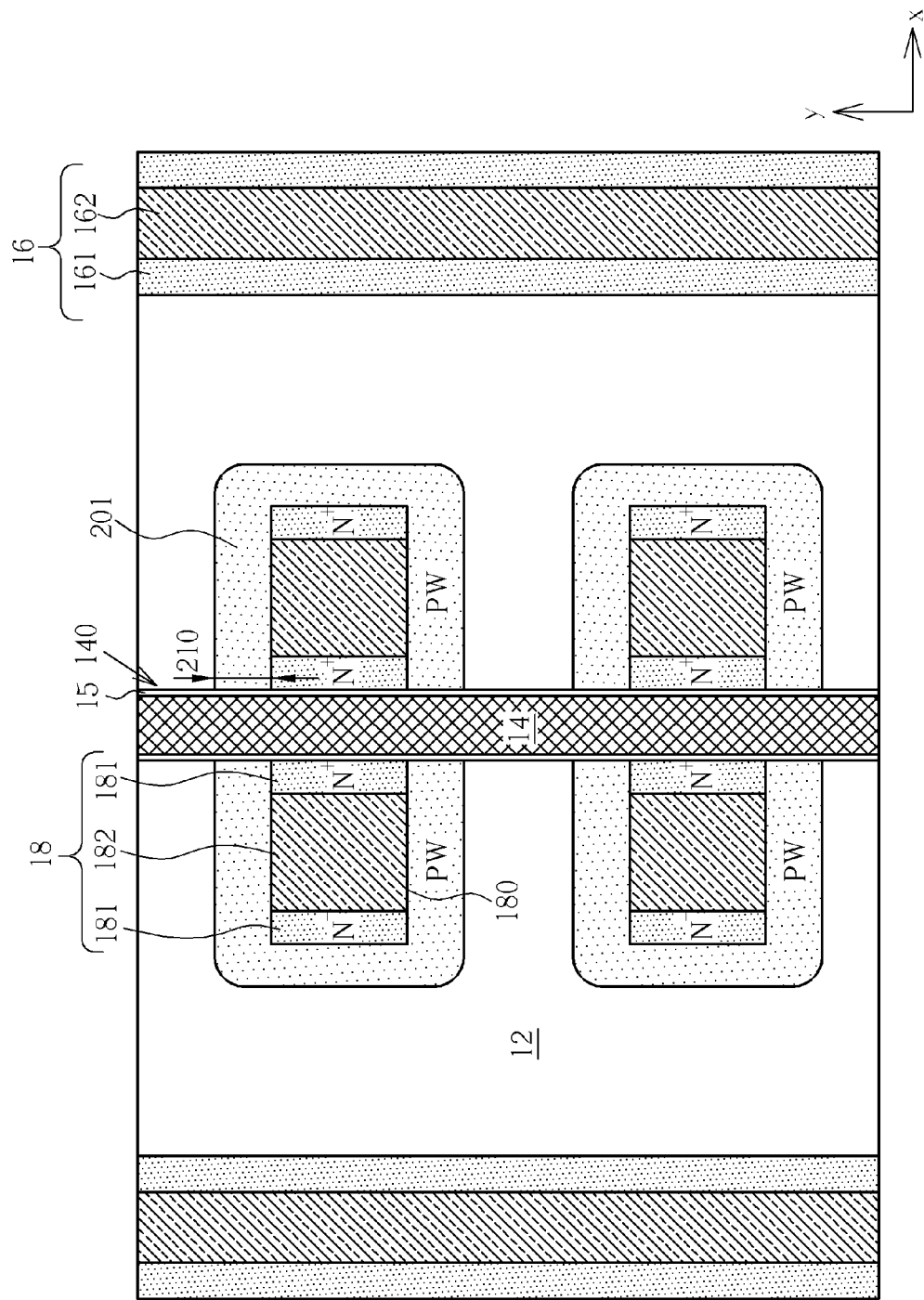
FIG. 3 is a schematic top-view showing a structure of a lateral stack-type super junction power semiconductor device according to a third embodiment of the invention.

FIG. 3 is a schematic top-view showing a structure of a lateral stack-type super junction power semiconductor device according to a third embodiment of the invention, wherein similar layers, devices, and regions are described with the same numerals as above. As shown in FIG. 3, a gate trench 140 is a continuous trench formed along the y-axis direction. Source structures 18 are located on both side of the gate trench 140, wherein the source structures 18 comprise a pair of source diffusion regions 181 with a second conductivity type and one of which is adjacent to one side of the gate trench 140. A source trench 180 is located between two source diffusion regions 181, which are filled with a source contact layer 182, made of metal for example. The source diffusion region 181 and the source contact layer 182 constitute a source structure 18. Similarly, the source diffusion region 181 is encompassed by an ion well 201 of the first conductivity type with no ion well trench inside the ion well 201. The source contact layer 182 is in direct contact with, and electrically coupled to the ion well 201. A gate channel 210 is formed in a region where the ion well 201 overlaps the gate conductive layer 14, which is next to the source diffusion region 181. The gate channel 210 defines a gate length, and a width of gate channel 210 is defined by each epitaxial layer 121.

Figure 4:
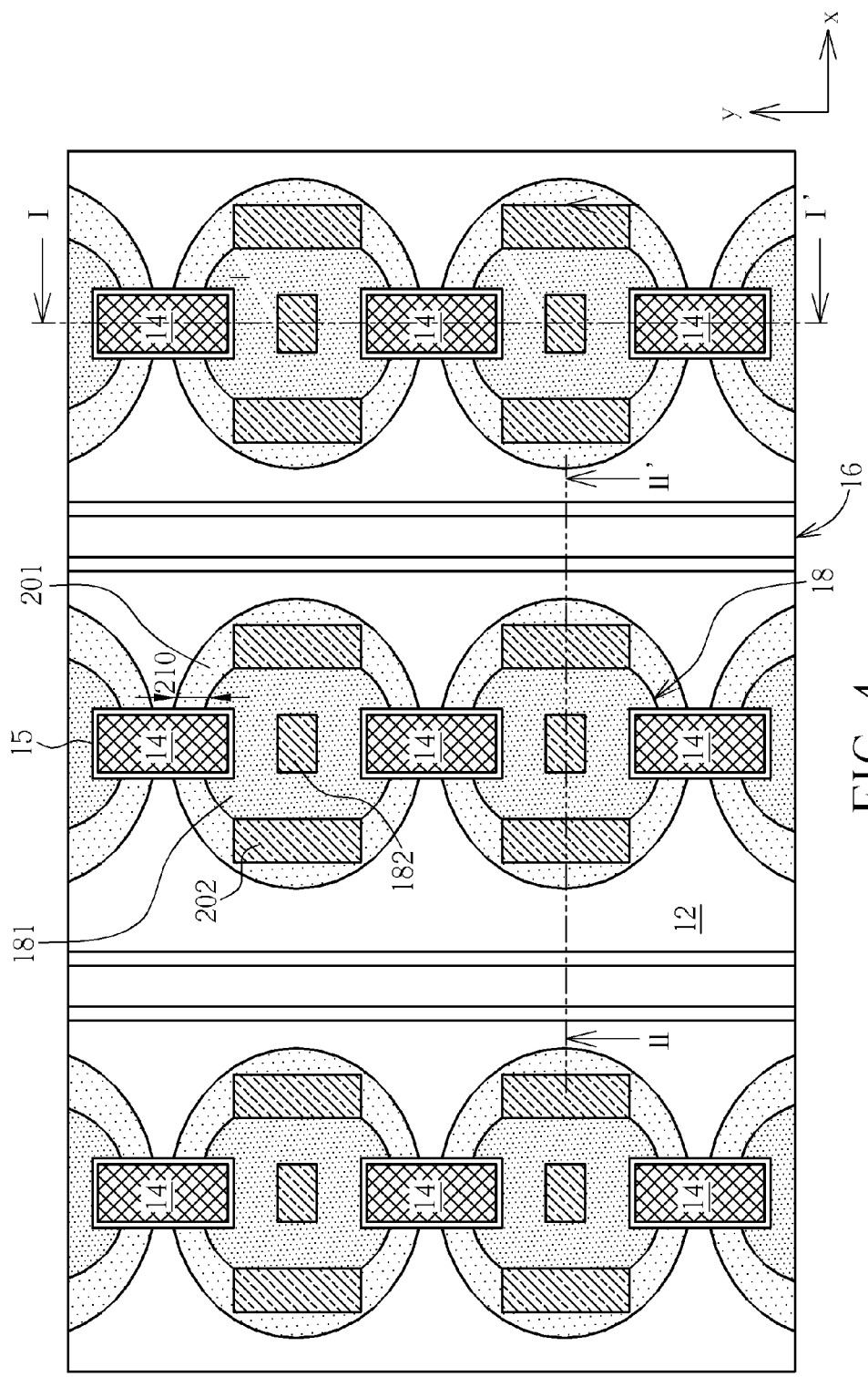
FIG. 4 is schematic, top-view diagram showing a partial layout of a lateral stack-type super junction power semiconductor device according to embodiments of the invention.

In the following paragraph, a process of fabricating a lateral stack-type super junction semiconductor device will be described with the corresponding drawings. FIG. 4 is schematic, top-view diagram showing a partial layout of a lateral stack-type super junction power semiconductor device according to the embodiments of the invention. FIGS. 5-16 are schematic, cross-sectional diagrams taken along lines I-I' and II-II' of the FIG. 4, wherein the line I-I' intersects the gate conductive layer 14 and the source structure 18 along the y-axis direction, while the II-II' line intersects the ion well 201, the source structure 18, and the drain structure 16 along the x-axis direction.

Figure 5:
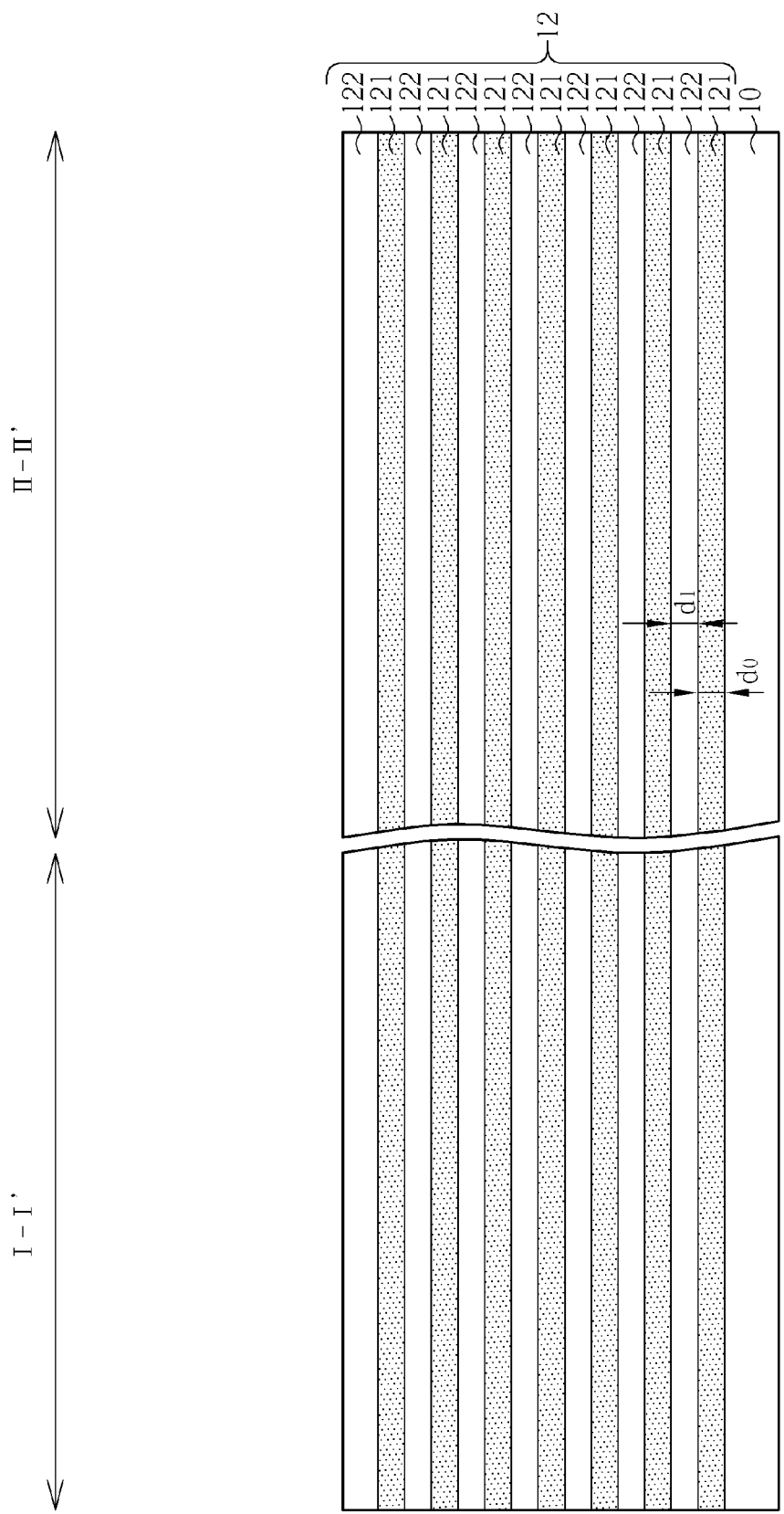
FIGS. 5-16 are schematic, cross-sectional diagrams showing a method for fabricating a lateral stack-type super junction power semiconductor according to embodiments of the invention.

As shown in FIG. 5, a semiconductor substrate 10 doped with the first conductivity type, for example a P-type silicon substrate, is provided. An epitaxial stack layer 12 is then formed on the semiconductor substrate 10, wherein the layer 12 consists of a plurality of epitaxial layers 121 doped with a second conductivity type, N-type for example, and epitaxial layers 122 of the first conductivity type. The layers 121 and 122 are arranged alternatively along a z-axis direction, so that the interfaces between the epitaxial layers 121 and 122 are parallel to a surface (or XY plane) of the semiconductor substrate 10. The interfaces consist of a plurality of PN junctions and are therefore known as "super-junctions". A thickness of the epitaxial layers 121 may be equal to that of the epitaxial layers 122 but is not limited to this. For example, an epitaxial layer 121 in direct contact with the substrate 10 may be thicker than other epitaxial layers 121 to reduce the resistance: a thickness d0 of the epitaxial layer 121 in direct contact with the semiconductor substrate 10 may be thicker than thickness d1 of epitaxial layer 122 to reduce the resistance. In addition, depending on a required on-resistance (RDS) value, an entire thickness of the epitaxial stack layer 12 and the number of the epitaxial layers 121 and 122 may be adjusted.

Figure 6:
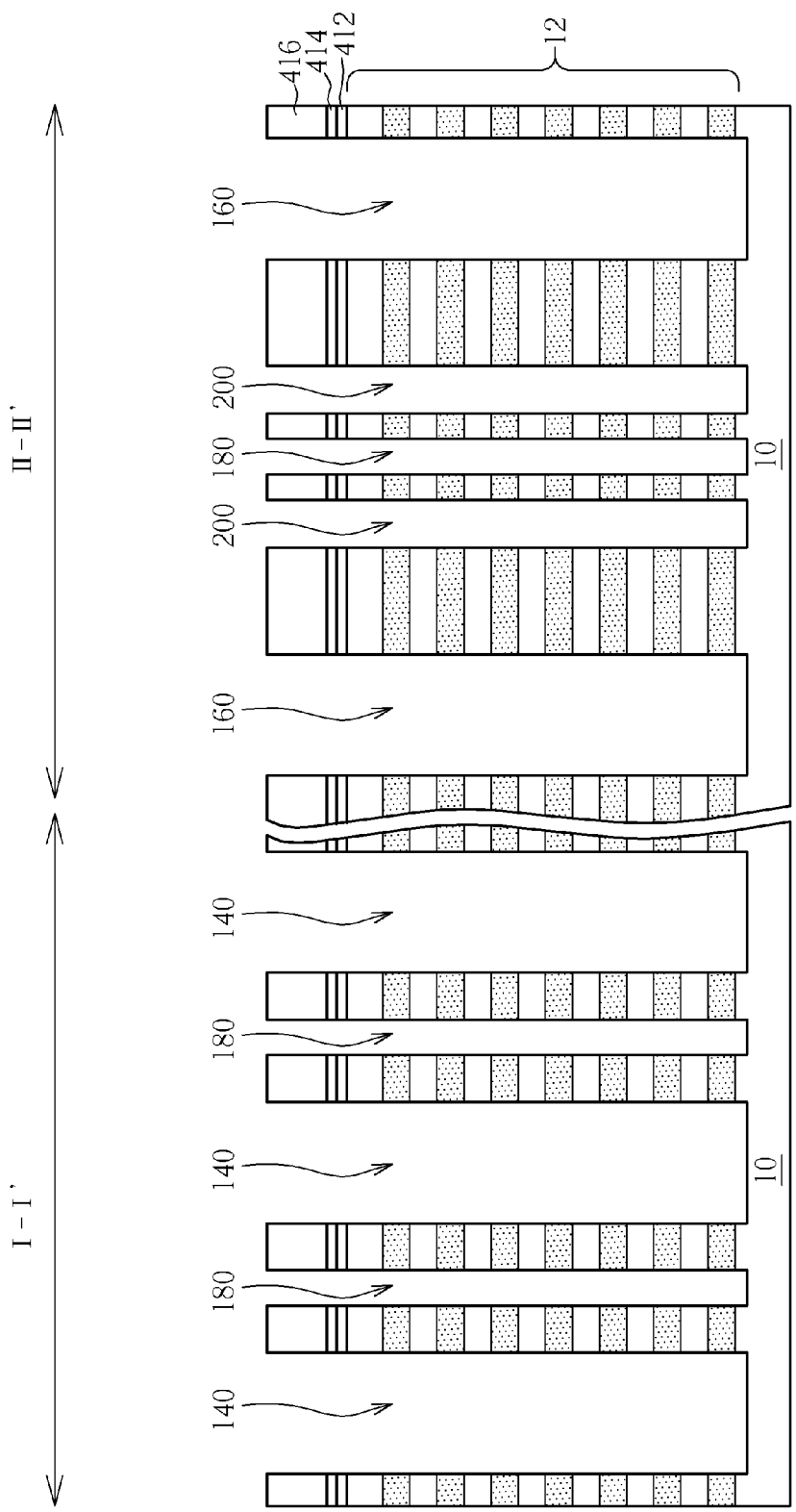

Please refer to FIG. 6. A pad oxide layer 412, a pad nitride layer 414, and a hard mask 416 are formed sequentially on the epitaxial stack layer 12. Then a gate trench 140, a source trench 180, a drain trench 160, and an ion well trench 200 are formed in a predetermined region by using a photolithographic and an etching process. As described above, the depth of the gate trench 140, of the source trench 180, of the drain trench 160, and of the ion well trench 200 may be adjusted to expose the epitaxial layer 121 in direct contact with the semiconductor substrate 10. It is worth noting that the voltage sustaining ability is determined by the distance between the drain trench 160 and the ion well trench 200.

Figure 7:
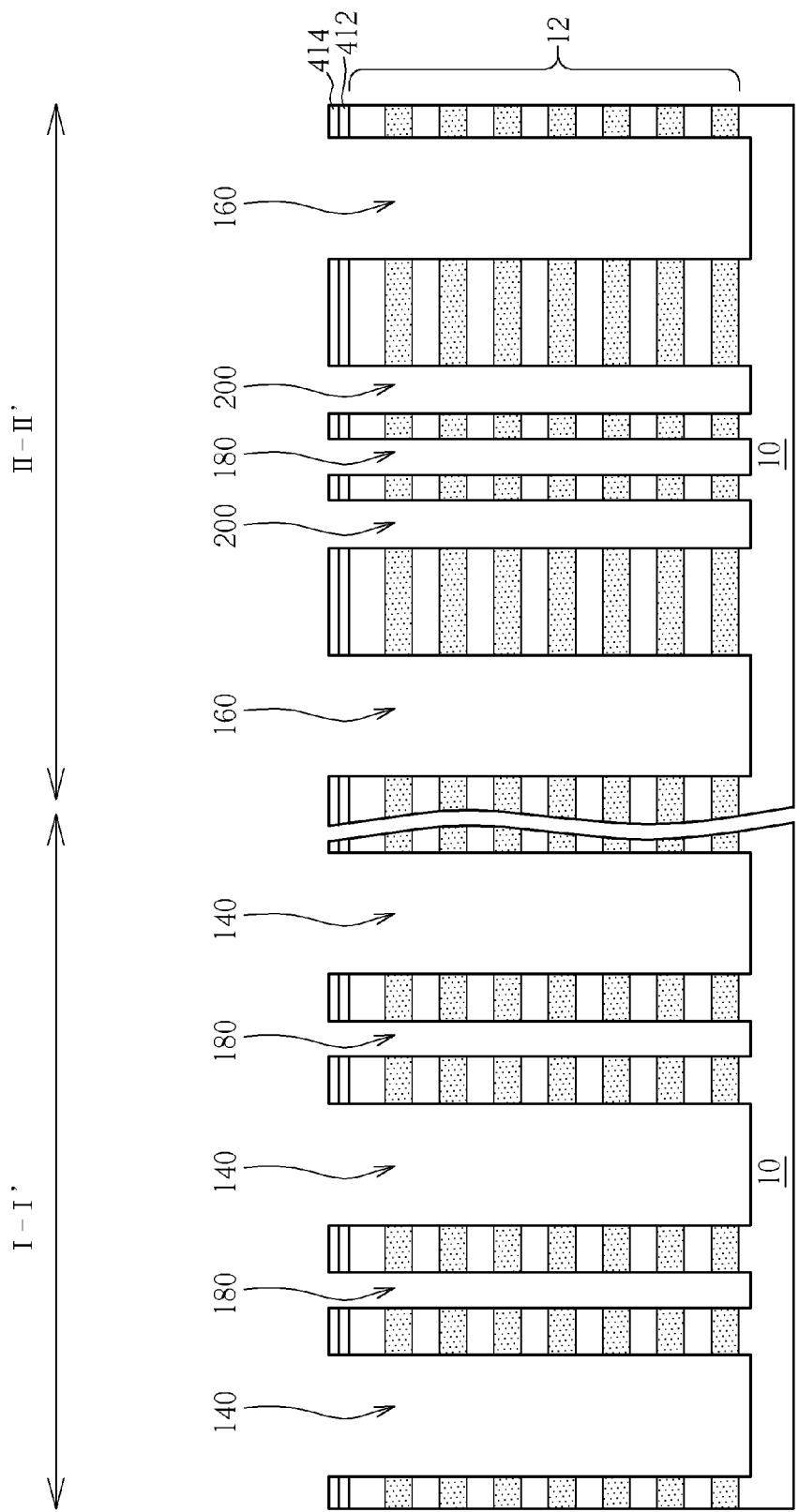

Please refer to FIG. 7. The hard mask 416 is removed, and the pad oxide layer 412 and pad nitride 414 remain on the surface of the epitaxial stack layer 12. An oxidation process is then carried out to form a sacrificial oxide layer (not shown) on the surface of the gate trench 140, the source trench 180, the drain trench 160, and the ion well trench 200. The sacrificial layer is removed later. It should be noted that defects originally existing on the surface of the gate trench 140, the source trench 180, the drain trench 160, and the ion well trench 200 are embedded in the sacrificial oxide layer after the formation of the latter. When removing the sacrificial layer, the defects can therefore be eliminated.

Figure 8:
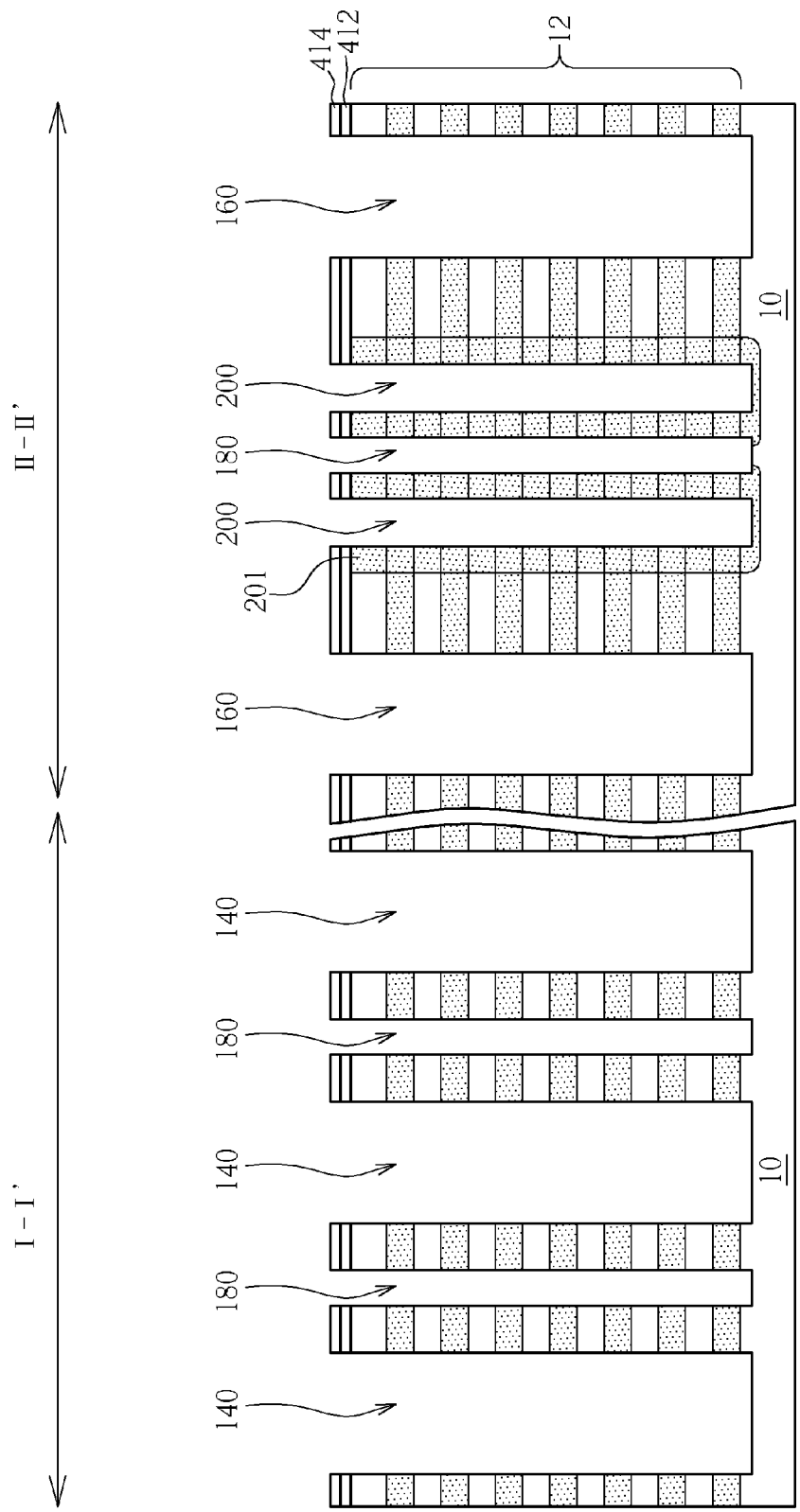

As shown in FIG. 8, a patterned photoresist (not shown) is formed on the epitaxial stack layer 12 through a photolithography process, which exposes a region where an ion well 201 is supposed to be formed. A tilted-angle ion implantation is carried out to implant the first conductivity dopants, P-type dopants for example, into the epitaxial stack layer 12; this way the ion well 201 with the first conductivity type is formed inside said region. Then, the patterned photoresist is removed and a thermal process is performed to diffuse and activate the dopants inside the ion well 201. In another embodiment, the ion implantation process may be replaced with a thermal diffusion process, for example: a dopant source layer is formed on the surface of the desired trench, such as the source trench 180 and the ion well trench 200, then a thermal process is performed to diffuse dopants from the dopant source layer into the desired trench.

Figure 9:
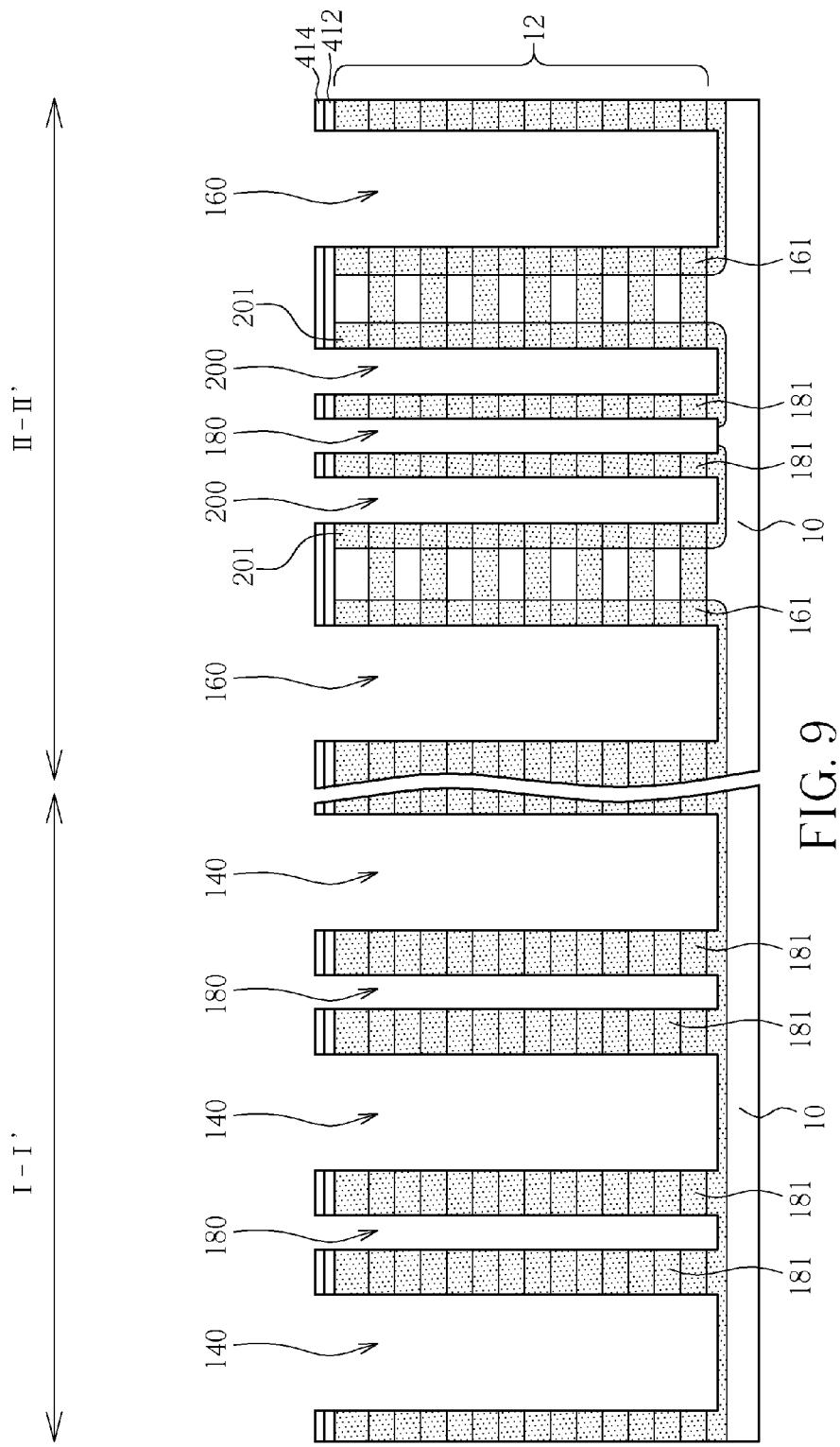

Then, as shown in FIG. 9, another patterned photoresist (not shown) is formed on the epitaxial stack layer 12 through a photolithography process. The patterned photoresist exposes regions where a source and a drain are supposed to be formed. A tilted-angle ion implantation is carried out to implant the second conductivity type dopants, N-type dopants for example, into the epitaxial stack layer 12; therefore, the drain diffusion region 161 and the source diffusion region 181 are formed inside said regions. The photoresist pattern is then removed and a thermal process is performed to diffuse and activate the dopants. In another embodiment, the ion implantation process may be replaced with a thermal diffusion process, for example: a dopant source layer is formed on a surface of specific trenches, a thermal process is then performed to diffuse dopants from the dopant source layer into the surface of the trenches. Additionally, the source and the drain doped regions may be formed separately in order to meet different doping concentration requirements.

Figure 10:
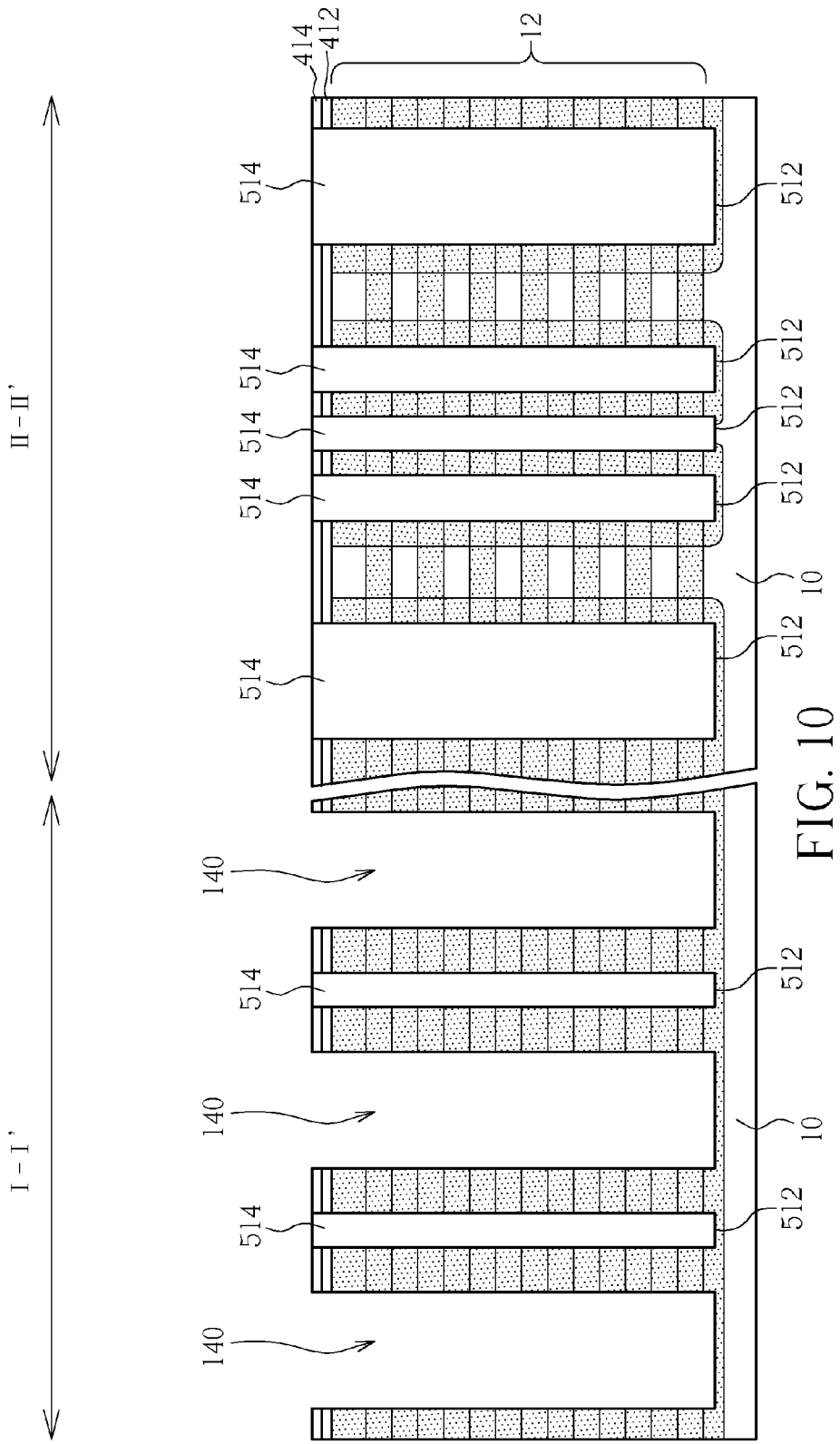

As shown in FIG. 10, a trench oxidation process is performed to form a liner oxide 512 on the surfaces of the gate trench 140, the source trench 180, the drain trench 160, and the ion well trench 200. Then, a chemical vapor deposition (CVD) process is performed to fill up the gate trench 140, the source trench 180, the drain trench 160, and the ion well trench 200 with a silicon oxide layer 514, followed by a polishing process, like a chemical mechanical polishing process (CMP), to planarize the surface of the epitaxial stack layer 12. Finally, the silicon oxide layer 514 and the liner oxide 512 inside the gate trench 140 are removed sequentially through a photolithography process and an etching process, and then the photoresist is removed.

Figure 11:
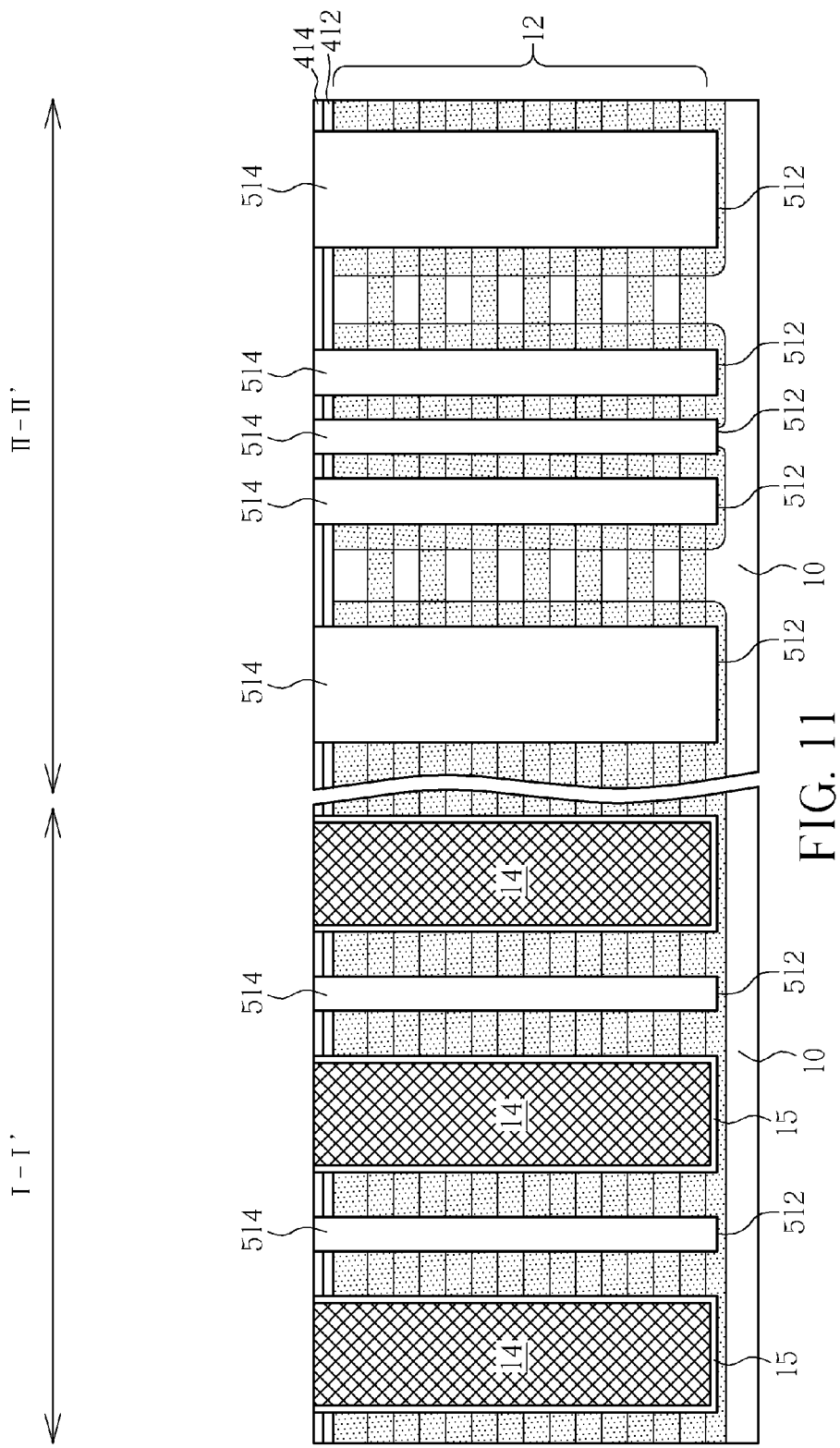

Please refer to FIG. 11. An oxidation process is carried out to form a gate dielectric layer 15 on the inner surface of the gate trench 140, like silicon dioxide for example. The gate trench 140 is filled with a conductive layer 14, polysilicon for example, through a CVD process. Then, the gate conductive layer 14 outside the gate trench 140 is removed and planarized by performing a CMP process.

Figure 12:
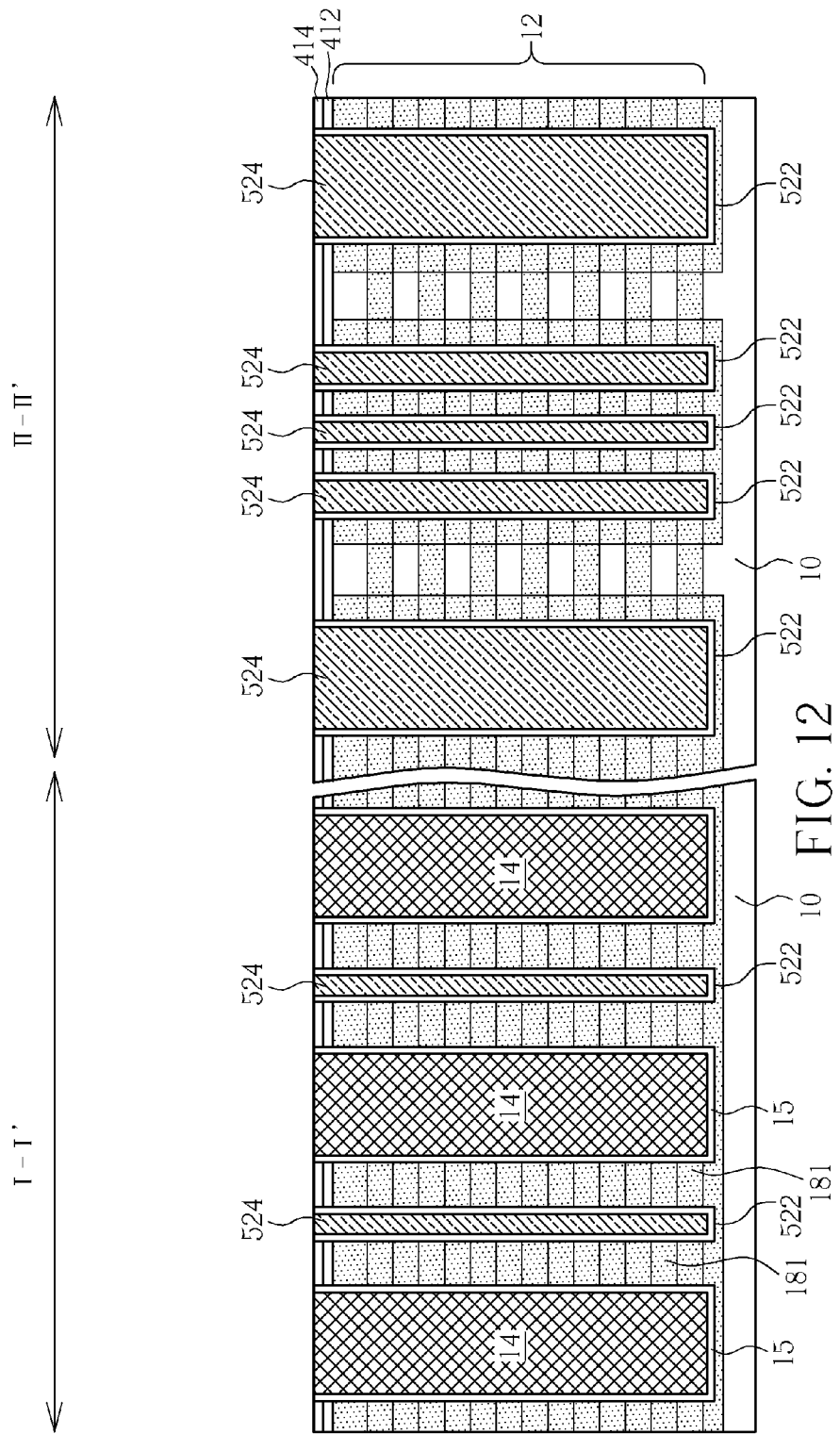

As shown in FIG. 12, a photolithography process is performed to form a photoresist pattern (not shown), which only covers the gate trench 140 and the gate conductive layer 14 inside the gate trench 140, which therefore exposes the silicon oxide layer 514 and the liner oxide 512 inside the source trench 180, the drain trench 160 and the ion well trench 200. Afterward the Silicon oxide layer 514 and the liner oxide 512 are removed through an etching process. After this step, the photoresist is then removed. Layers of Ti/TiN liner 522 and tungsten layer 524 are formed on the epitaxial stack layer 12 successively wherein the Ti/TiN liner 522 is located between the tungsten layer 524 and the epitaxial stack layer 12. Finally, the metal layer outside the source trench 180, the drain trench 160, and the ion well trench 200 is removed and planarized by performing a CMP process.

Figure 13:
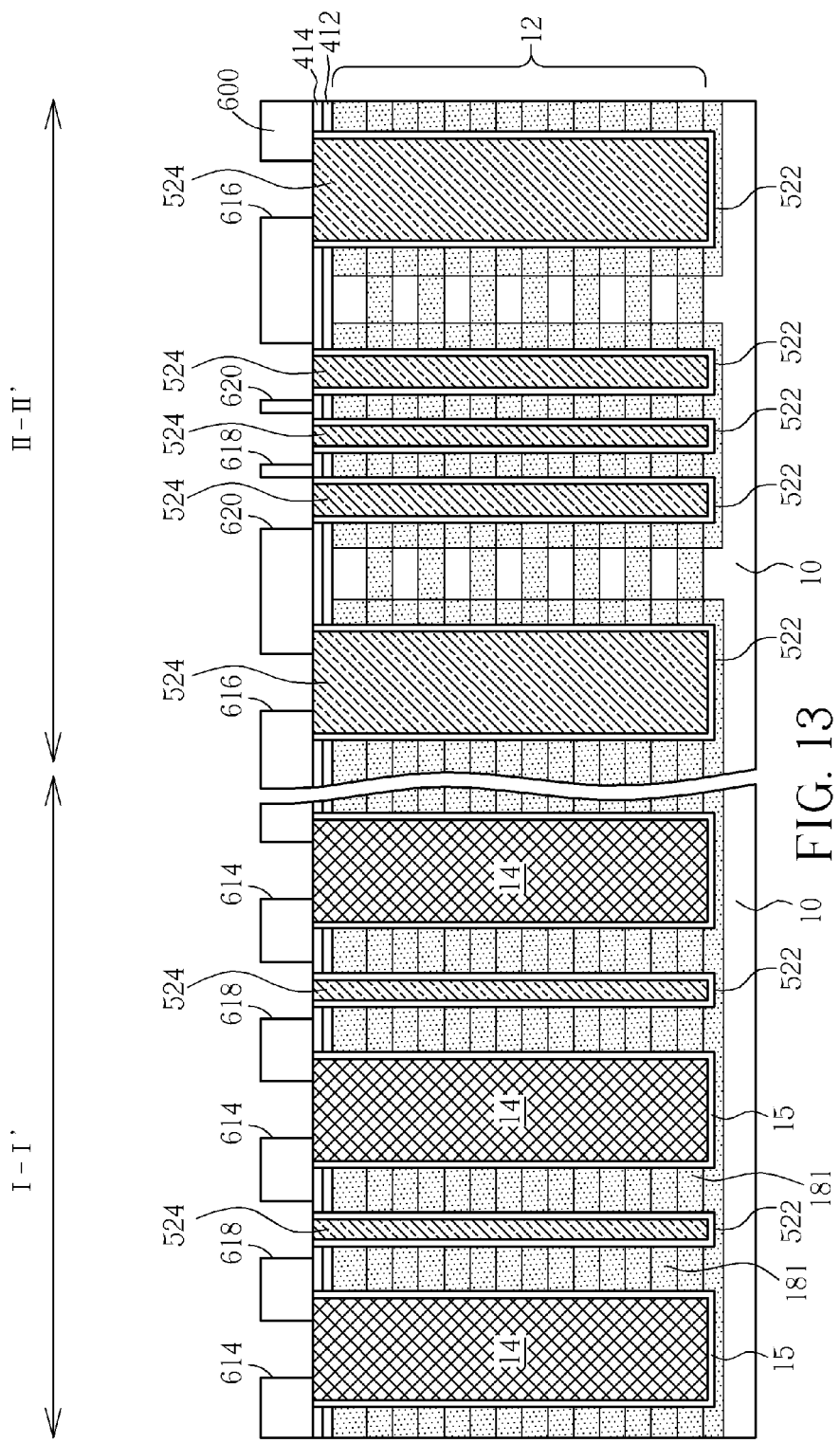

Please refer to FIG. 13. A dielectric layer 600, silicon oxide for example, is formed on the epitaxial stack layer 12. A photoresist pattern is formed on the dielectric layer 600 to expose regions where contact holes are supposed to be formed, wherein the contact holes are located above the gate trench 140, the source trench 180, the drain trench 160, and the ion well trench 200 respectively. A dry etching process is then performed, using the photoresist pattern as an etch mask, to form a gate contact hole 614, a drain contact hole 616, a source contact hole 618, and an ion well contact hole 620, respectively that expose the gate conductive layer 14 filling the gate trench 140, and the tungsten layer 524 inside the source trench 180, the drain trench 160, and the ion well trench 200. Finally, the patterned photoresist is removed.

Figure 14:
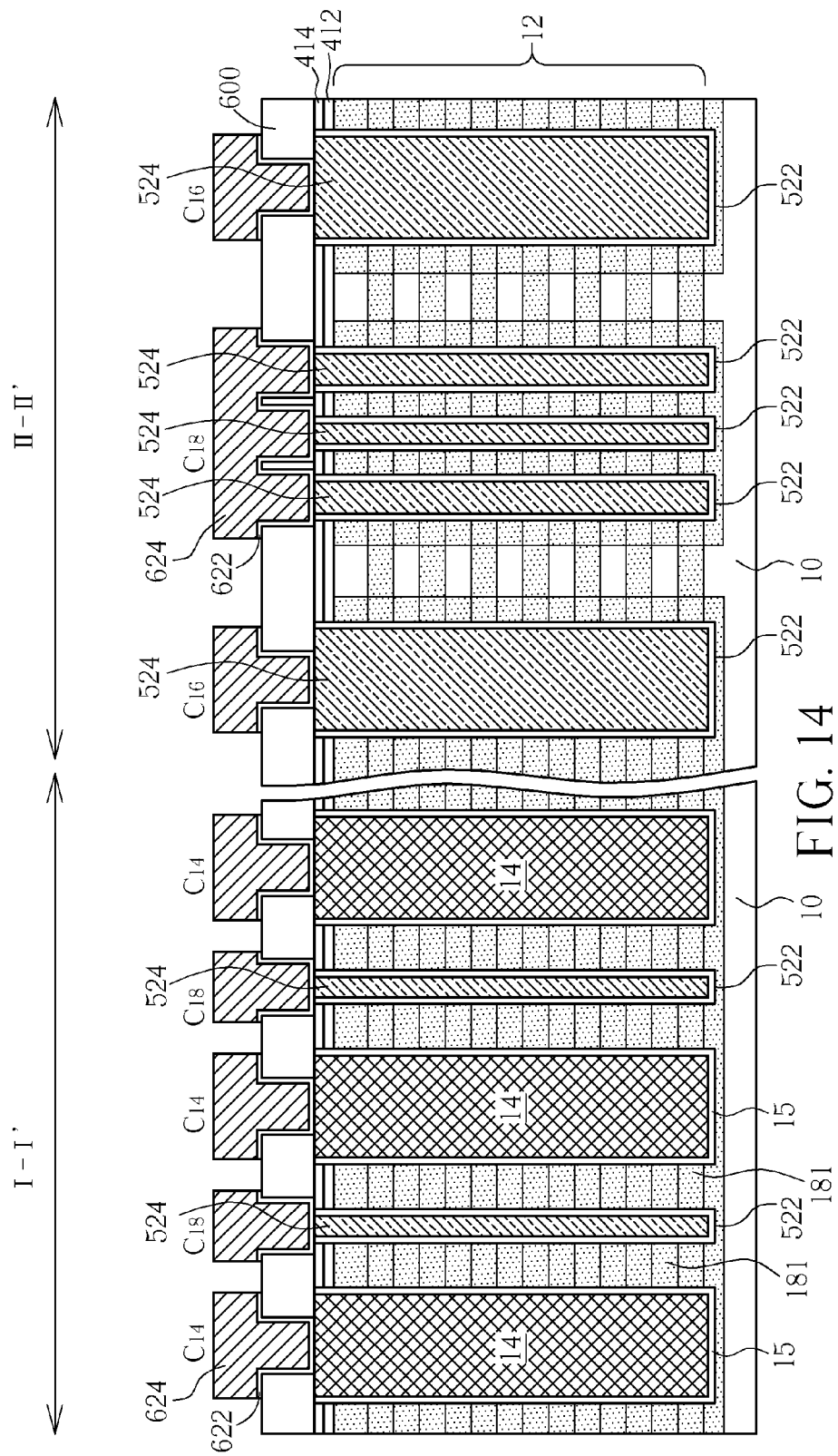

As shown in FIG. 14, a Ti/TiN liner 622 is deposited on the dielectric layer 600 and a metal layer 624 is formed on the Ti/TiN liner 622, an aluminum silicon copper alloy for example. The metal layer 624 and the Ti/TiN liner 622 are patterned by performing a photolithography and an etching process to form a gate contact plug C14, a drain contact plug C16, and a source contact plug C18, wherein the source contact plug C18 is electrically connected to the tungsten layer 524 inside the source trench 180 and the ion well trench 200.

Figure 15:
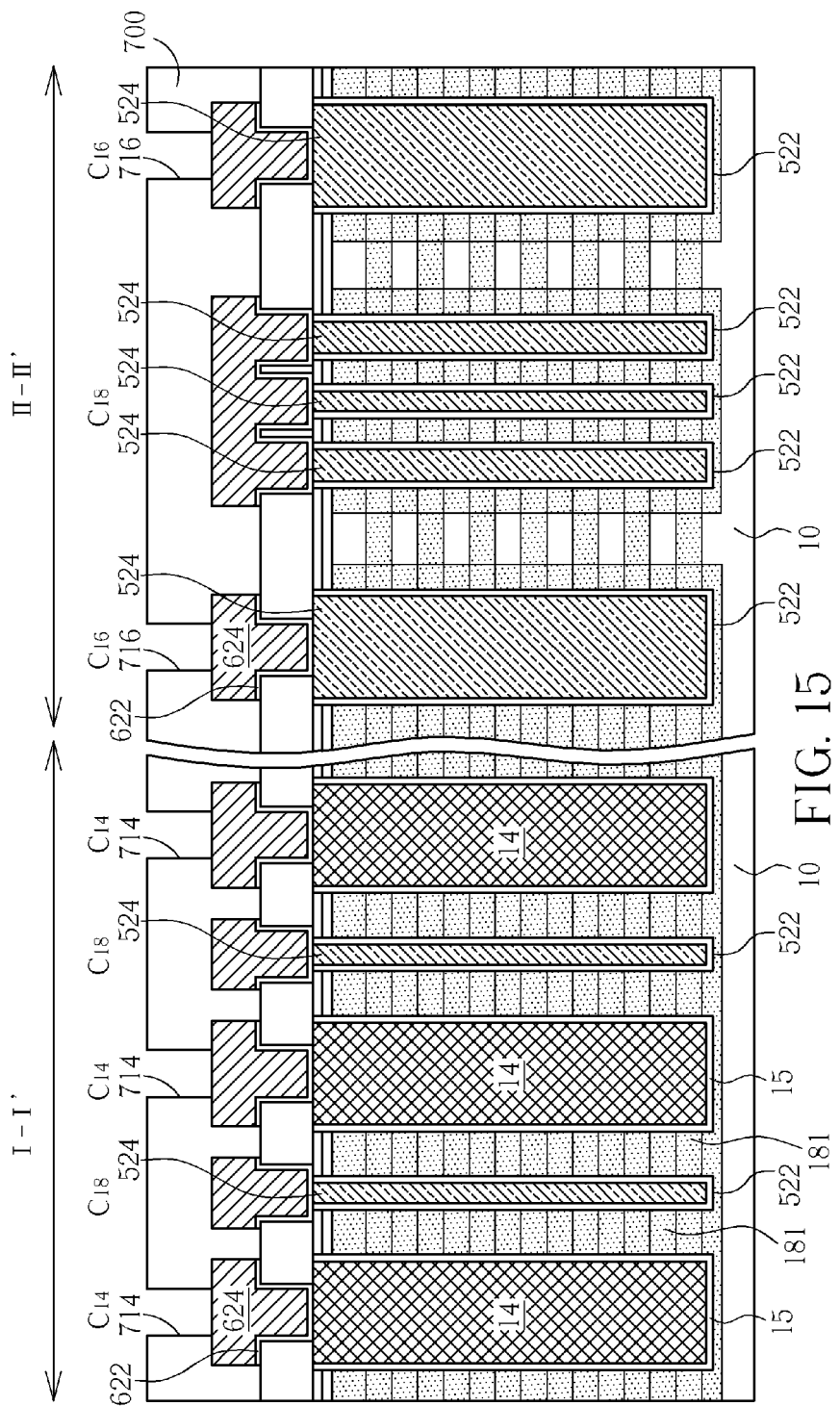

As shown in FIG. 15, a dielectric layer 700, silicon oxide for example, is formed on the dielectric layer 600 to cover the gate contact plug C14, the source contact plug C18, and the drain contact plug C16. A patterned photoresist (not shown) is then formed on the dielectric layer 700, which exposes regions where via holes are supposed to be formed. The via holes are located above the gate contact plug C14, the source contact plug C18, and the drain contact plug C16 respectively. A dry etching process is then performed by using patterned photoresist as an etch mask to form a gate contact plug via hole 714 and a drain contact plug via hole 716 in the dielectric layer 700, which exposes the gate contact plug C14, and the drain contact plug C16. Then, the patterned photoresist is removed.

Figure 16:
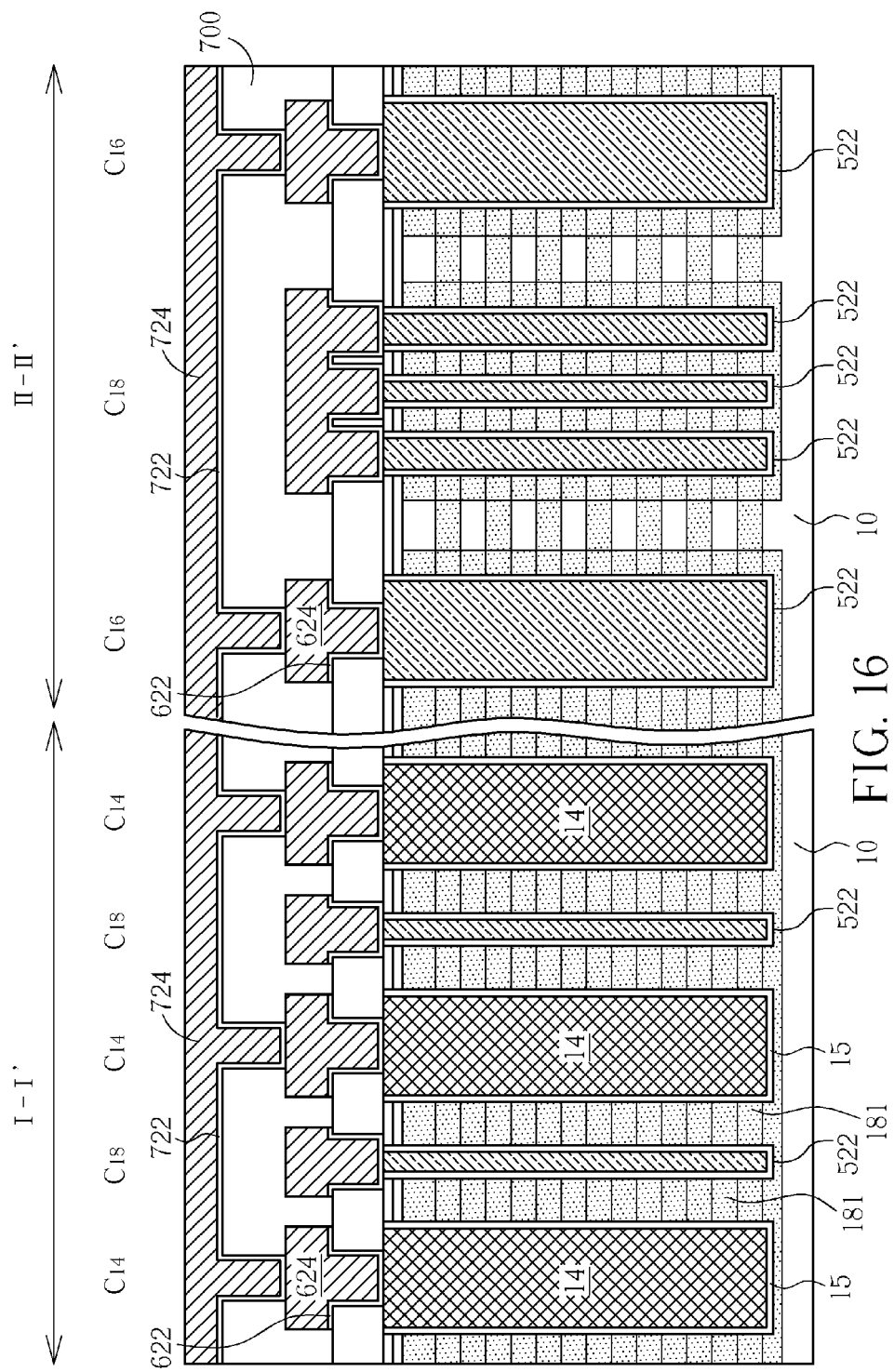

As shown in FIG. 16, a Ti/TiN liner 722 is deposited on the dielectric layer 700 and a metal layer 724 is formed on the Ti/TiN liner 722, an aluminum silicon copper alloy for example. The metal layer 624 and Ti/TiN liner 622 are patterned by performing a photolithography and etching process to form conductive patterns.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral stack-type super junction power semiconductor device, comprising:
   a semiconductor substrate with a first conductivity type;
   an epitaxial stack structure on the semiconductor substrate, having at least a first epitaxial layer with a second conductivity type and at least a second epitaxial layer with the first conductivity type;
   a drain structure embedded in the epitaxial stack structure along a first direction;
   a plurality of gate structures embedded in the epitaxial stack structure and arranged in a segmental manner along the first direction;
   a source structure between the plurality of gate structures; and
   an ion well with the first conductivity type encompassing the source structure, wherein the ion well extends through an entire thickness of the epitaxial stack structure.

2. The lateral stack-type super junction power semiconductor device according to claim 1 wherein each of the gate structures comprises a gate conductive layer embedded in a gate trench, with a gate dielectric layer covering the gate conductive layer.

3. The lateral stack-type super junction power semiconductor device according to claim 2 wherein the source structure comprises a source diffusion region, a source trench situated in the source diffusion region, and a source contact layer in the source trench.

4. The lateral stack-type super junction power semiconductor device according to claim 3 wherein the ion well overlaps the gate conductive layer, thereby forming a gate channel next to the source diffusion region.

5. The lateral stack-type super junction power semiconductor device according to claim 4 wherein a current path along a second direction is created in the first epitaxial layer when the gate channel is turned on.

6. The lateral stack-type super junction power semiconductor device according to claim 3 further comprising an ion well trench situated in the ion well, and an ion well contact layer in the ion well trench.

7. The lateral stack-type super junction power semiconductor device according to claim 6 wherein the ion well contact layer is electrically coupled to the source contact layer.

8. The lateral stack-type super junction power semiconductor device according to claim 3 wherein the source diffusion region extends through an entire thickness of the epitaxial stack structure.

9. The lateral stack-type super junction power semiconductor device according to claim 1 wherein the first epitaxial layer and the second epitaxial layer constitute a PN junction that is substantially parallel with a main surface of the semiconductor substrate.

10. The lateral stack-type super junction power semiconductor device according to claim 1 wherein the first epitaxial layer is in direct contact with the semiconductor substrate.

11. The lateral stack-type super junction power semiconductor device according to claim 10 wherein the second epitaxial layer is stacked on the first epitaxial layer.

12. The lateral stack-type super junction power semiconductor device according to claim 1 wherein the first epitaxial layer and the second epitaxial layer have different thicknesses.

13. The lateral stack-type super junction power semiconductor device according to claim 1 wherein a thickness of the first epitaxial layer is greater than that of the second epitaxial layer.

14. A lateral stack-type super junction power semiconductor device, comprising:
   a semiconductor substrate with a first conductivity type;
   an epitaxial stack structure on the semiconductor substrate, having at least a first epitaxial layer with a second conductivity type and at least a second epitaxial layer with the first conductivity type;
   a drain structure embedded in the epitaxial stack structure along a first direction;
   a gate structure embedded in the epitaxial stack structure along the first direction;
   a source structure disposed on either side of the gate structure; and
   an ion well with the first conductivity type encompassing the source structure, wherein the ion well extends through an entire thickness of the epitaxial stack structure.

15. The lateral stack-type super junction power semiconductor device according to claim 14 wherein each of the gate structures comprises a gate conductive layer embedded in a gate trench, and a gate dielectric layer covering the gate conductive layer.

16. The lateral stack-type super junction power semiconductor device according to claim 15 wherein the source structure comprises a source diffusion region, a source trench situated in the source diffusion region, and a source contact layer in the source trench.

17. The lateral stack-type super junction power semiconductor device according to claim 16 wherein the ion well overlaps the gate conductive layer, thereby forming a gate channel next to the source diffusion region.

18. The lateral stack-type super junction power semiconductor device according to claim 16 wherein the source diffusion region extends through an entire thickness of the epitaxial stack structure.

* * * * *